United States Patent [19]

Smith et al.

[11] 4,180,738
[45] Dec. 25, 1979

[54] ASTIGMATISM IN ELECTRON BEAM PROBE INSTRUMENTS

[75] Inventors: Kenneth C. A. Smith, Cambridge; William J. Tee, Bishops Stortford, both of England

[73] Assignee: National Research Development Corporation, London, England

[21] Appl. No.: 928,620

[22] Filed: Jul. 27, 1978

[30] Foreign Application Priority Data

Jul. 30, 1977 [GB] United Kingdom ............... 32084/77

[51] Int. Cl.$^2$ ............................................. G21K 1/08
[52] U.S. Cl. ............................. 250/396 ML; 250/311; 250/396 R
[58] Field of Search ................. 250/396, 311, 396 ML, 250/396 R

[56] References Cited

U.S. PATENT DOCUMENTS

| 3,371,206 | 2/1968 | Takizawa | 250/396 |
|---|---|---|---|
| 3,453,485 | 7/1969 | Hermmann et al. | 250/396 |
| 3,597,609 | 8/1971 | Anger | 250/311 |
| 3,753,034 | 8/1973 | Spicer | 250/396 |

Primary Examiner—Harold A. Dixon
Attorney, Agent, or Firm—Cushman, Darby & Cushman

[57] ABSTRACT

Supplies for the objective lens scanning coils and stigmator coils of a scanning electron microscope are arranged for digital control by a small computer which receives a digitized input from an imaging electron collector. For a specimen of suitable structure the computer can be programmed for automatic focusing and astigmatism correction or the operator can intervene to apply a manual correction. Astigmatism is detected by comparing the directional derivatives of intensity for corresponding points in two frames with lens settings above and below focus. By taking the difference between the derivatives for each direction of measurement the effect of structural directional features is eliminated; by summing the differences for all directions a value (S) is obtained which represents the magnitude of astigmatism. The required orientation of the stigmator field can be calculated and the excitation current scanned through a range of values to determine the setting for which S is a minimum.

10 Claims, 6 Drawing Figures

ASTIGMATISM IN ELECTRON BEAM PROBE INSTRUMENTS

This invention relates to a method and apparatus for the investigation and correction of astigmatism in the focusing system of an electron beam probe instrument such as the scanning electron microscope (SEM).

Astigmatism is the defect in a focusing system which results in failure to achieve precise focus at a point in the intended focal plane but instead provides a line focus position above the plane and a further line focus position below the plane. The axes of the line foci are mutually perpendicular. In the SEM, astigmatism is a serious limitation on the spatial resolution of the scanning image of a specimen and since the cross-sectional shape of the beam at the specimen surface cannot be visualised directly it is conventional practice to make compensating adjustments to the focusing field until the image appears satisfactory. In a magnetic system the adjustments are made by supplying current to an arrangement of auxiliary coils known as a stigmator. Effective control of the stigmator by an operator requires considerable experience and time and readjustment may be necessary whenever the focus conditions is re-set or drifts as a result of thermal or electrical changes.

It is an object of the invention to enable the detection and estimation of astigmatism to be simplified and the necessary correction to be applied without reliance on skilled assessment of focal quality.

In accordance with a first aspect of the invention there is provided a method for investigating and correcting astigmatism in an electron beam probe instrument comprising a sequence of automatic operations, namely, scanning an array of points on a specimen, setting the excitation of the objective lens to enable a focused image of the specimen to be produced, resetting the lens excitation in turn to a first value below the setting for focus and to a second value above the setting for focus, determining for the first and second values of lens excitation the directional derivatives of intensity in a plurality of directions for each point of the array, deriving the difference between the respective sums for all points of the array of the derivative in each direction for the first value of excitation and the derivative in each corresponding direction for the second value of excitation and determining the sum of such differences, the sum, denoted by S, being a measure of the astigmatism, and manually or automatically operating astigmatism compensation means to minimise the value of S.

It will be made clear that images corresponding to the first and second values will contain features characteristic of the two line foci and that the method identifies such features.

Preferably the sets of directional derivatives are normalised before deriving the difference between them.

The sum S may be determined for a succession of settings of an astigmatism correction means and the setting selected for which S is close to a minimum.

In general the procedure for image analysis requires the aid of a computer but provided the necessary values of S can be computed the astigmatism correction means can be controlled manually.

The setting of the astigmatism correction means refers to the orientation of the field and to the level of excitation. The required orientation may be determined, in terms of the angle of smearing of the image, from the differences between corresponding average derivatives.

The setting of the lens excitation for focus may be performed by a visual assessment or by computer. In the latter case the sum for all points in the array of the gradient at each point may be determined and the value of lens excitation then determined for which the sum of the gradients has a maximum value.

According to a second aspect of the invention there is provided apparatus for investigating and correcting astigmatism in an electron beam probe instrument comprising means for causing the electron beam to scan an array of points on a specimen, means for setting the excitation of the objective lens to a value enabling a focused image of the specimen to be produced and to first and second values respectively below and above the setting for focus, means for determining the intensity of the image of each point in the array, means for storing such values of intensity, means for determining from the stored values the directional derivatives of intensity in a plurality of directions for each point for the first and second values of lens excitation, means for deriving the difference between the respective sums for all points of the array of the derivative in each direction for the first value of lens excitation and the derivative in each corresponding direction for the second value of lens excitation, means for determining the sum of such differences, the sum, denoted by S, being a measure of the astigmatism, and astimatism compensation means operable in response to the value of S to cause S to be reduced towards a minimum.

Preferably the apparatus includes means for normalising the directional derivatives determined for one of the first and second values of lens excitation with respect to those determined for the other value.

The apparatus may include astigmatism compensation means having means for manual control of excitation and means for displaying the value of the sum S for each of a succession of excitation settings, whereby the setting for which S is close to a minimum may be selected.

Alternatively the apparatus may include astigmatism compensation means having means for programmed control of excitation in discrete steps, means for deriving from the differences between corresponding summed derivatives a value representing the angle of smearing of the image, means for setting the field orientation of the astigmatism compensation means to an angle so related to the angle of smearing as to produce correction of astigmatism in the image and means for determining the step in the excitation of the compensation means for which the value of S is close to a minimum.

Preferably the means for setting the lens excitation for focus includes means for determining the sum for all points of the intensity gradient at each point in the array and means for determining the value of lens excitation for which the sum of the gradients has a maximum value.

An embodiment of the apparatus and the method of operation of the invention will now be described with reference to the accompanying drawings in which.

Figure 1:
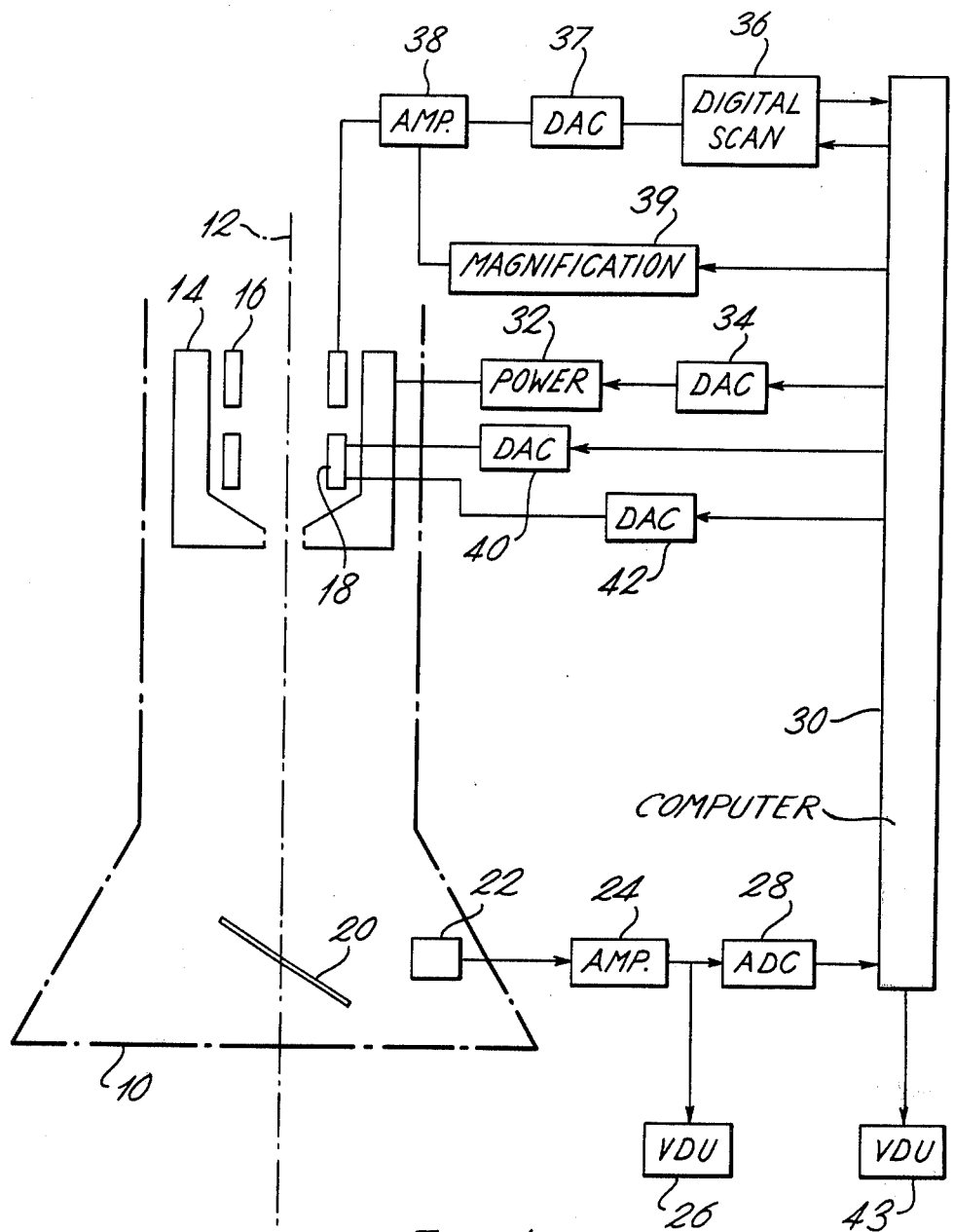
FIG. 1 represents schematically a scanning electron microscope and the associated supply and control apparatus for operation in accordance with the invention.

With reference to FIG. 1 it is only necessary to indicate schematically the relevant features of an SEM 10 since no modifications to the electron-optical column are necessarily involved in carrying out the invention. An electron beam is projected along an axis 12 passing through the magnetic fields of an objective lens 14, scan coils 16 and a stigmator 18 to intercept the surface of a specimen 20. Reflected electrons are collected by a detector 22 which provides an output signal representative of the structure of the specimen at each successive point in the scanning pattern. Conventionally the signal is applied via an amplifier 24 to modulate the corresponding scanning pattern which is observed on a visual display unit 26. It will be apparent that in the presence of an asymmetric focusing defect the signal from detector 22 does not at any instant represent precisely the notionally defined point on the specimen but includes a return from an adjacent area with the result that the cumulative image is 'smeared.'

In a conventional system the presence of astigmatism is judged visually from the image on the display unit 26 and manual corrections are made to the supplies to the stigmator 18. A stigmator employs a quadruple arrangement of coils to produce in a diametric plane a field pattern which compensates for the existing asymmetry. The pattern may be correctly orientated by rotating the stigmator but more commonly a second quadruple is used interdigitated with the first to enable the resultant field to be rotated to the selected position by appropriate excitation of the two sets of coils. A calibrated sin/-cos potentiometer is adjusted to provide components of excitation in proportion to the sine and cosine of the desired angle of orientation to the respective sets of coils. Readjustment may be necessary whenever the value of current to the objective lens drifts or requires to be reset; other disturbing influences may arise such as the build-up of contamination at beam apertures in the instrument.

The invention is based on the realisation that the diagnosis of astigmatism can be more rapidly and effectively carried out by the use of small-scale computing facilities to analyse the image and that the currents delivered to the stigmator coils can then be matched exactly to the degree of aberration. The correction can be made by the operator when the direction and magnitude of the astigmatism have been computed or can be automatically applied by the computor. The computer can also be programmed to control magnification and the objective lens excitation so that refocusing and readjustment of the stigmator can be performed automatically as often as is desired.

Referring again to FIG. 1 the schematic circuit indicates the standard supply units and the modifications which are necessary for computer analysis and control of image quality in the SEM 10. The video signal from detector 22 is passed via amplifier 24 to an 8-bit analogue-to-digital convertor (ADC) 28 for input to an appropriately programmed computer 30. A power supply 32 for objective lens 14 is digitally controlled from computer 30 via a 15-bit digital-to-analogue converter (DAC) 34. A digital scan generator 36 is required to excite the scan coils 16 and operates in response to a trigger signal from computer 30. The digital output from generator 36 is converted to analogue form in a DAC 37 and is amplified to a selected level in an amplifier 38. The area of the specimen to be exposed to the scanning frame is determined by the level of excitation of the scan coils 16, a choice from three levels being provided by an automatic magnification unit 39 which controls amplifier 38. Astigmatism correction signals are applied to the two sets of coils of stigmator 18 each via a 10-bit DAC 40, 42. Computer 30 has an associated video display unit 43.

Figure 2A:
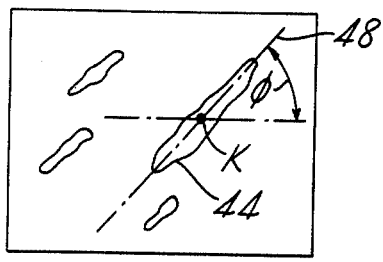
FIGS. 2a and 2b represent the forms of image obtained at the line foci of an SEM.
Figure 2B:
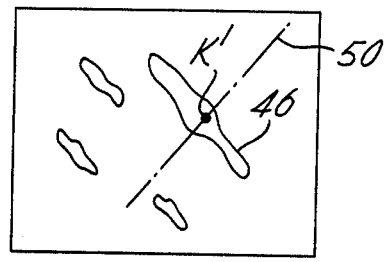

To consider the operation of the system in more detail it will first be supposed that the best obtainable focus condition has been established with the stigmator inoperative and that the corresponding value of lens current is held by the computer. That value is then incremented by a predetermined amount such that the electron beam at the surface of the specimen is close to one of the line focus conditions. With reference to FIG. 2(a) the effect of the line focus in producing in the visual image a smeared representation of structural features of the specimen is suggested by linearly extended areas 44. An angle of inclination $\phi$ with respect to a horizontal axis in the display can be assigned to the direction of smearing and is characteristic of the aberration to be corrected. It will be apparent that, on decrementing the value of lens current so that the electron beam approaches the alternative line focus condition, the visual image will be of the form indicated in FIG. 2(b) in which the same structural features are represented by linearly extended areas 46 having an angle of inclination $(\phi+90°)$.

Information on the presence and inclination of the areas 44 and 46 is obtained by measuring the approximate rate of change of intensity in specified directions from each picture point. It is convenient to use the term 'directional derivative of intensity' or briefly, 'intensity derivative,' for the estimate obtained by calculating discrete numerical values. For such a picture point K in FIG. 2(a) the derivative of intensity with distance along an axis 48 at an angle $\phi$ to the horizontal is very small since the measurement is made longitudinally within one of the areas 44; for the corresponding point K' in FIG. 2(b) the corresponding axis 50 cuts across the narrow dimension of an area 46 and the intensity derivative has (intermittently) a high value. The difference between the values at K and K' is therefore also large and such a result is indicative of strong astigmatism. In the absence of astigmatism the relevant areas 44 and 46 would be similar in shape and orientation and there would be little difference in the derivative values. On summing the intensity derivatives for all the points in the frame containing K and similarly in the frame containing K' a measure of the astigmatism over the whole frame is obtained by taking the difference between the sums. In practice an arbitrarily directed single axis 48, 50 (e.g., one lying approximately vertical or horizontal in FIGS. 2(a) and (b) might yield little or no information and therefore at least two and preferably more directions of measurement should be taken at each point. It should be noted that the specimen surface may be directionally structured so that the areas 44, 46 are not necessarily distortions of radially symmetric features. Such inherent features of the areas 44, 46 are however eliminated in using only the difference between the derivatives for K and for K'.

Figure 3:
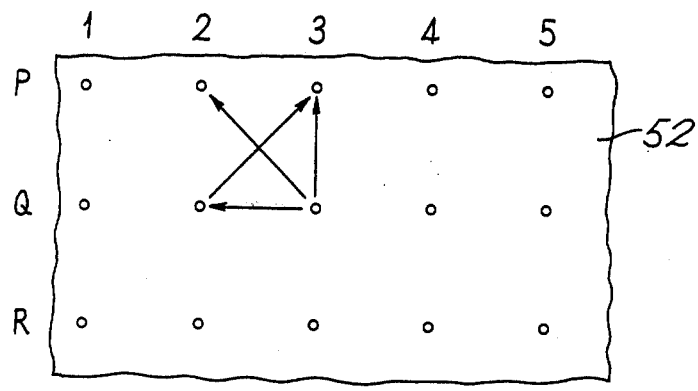
FIG. 3 represents an array of picture points within the image of FIG. 2a or 2b at which measurements are taken in operating the apparatus of FIG. 1.
Figure 4A:
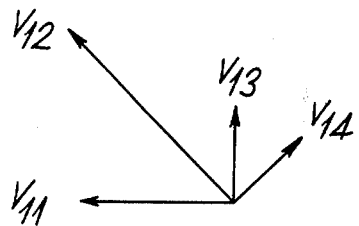
FIGS. 4a and 4b represent vectorially the measurements made on the images of FIGS. 2a and 2b respectively.
Figure 4B:
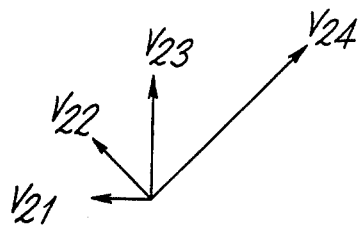

The procedure will be illustrated by considering an array of equally spaced points on the specimen which form the picture elements of a digitally controlled scanning frame. A small area of such an array 52 is shown in FIG. 3 (the rows being denoted P, Q, R, etc., and the columns 1, 2, 3, etc.). During the scanning of array 52 the computer 30 receives from detector 22 a value for the electron current collected from each point, which represents and may be referred to as the image intensity. The value for each point on the first line is stored and as soon as the scan of the second line is started values of intensity derivative are calculated. Thus, for a point $Q_3$ four vectors are obtained, the magnitudes of the vectors being the differences (always taken as positive) in intensity between the points $Q_3$ and $Q_2$, $Q_3$ and $P_2$, $Q_3$ and $P_3$ and $Q_2$ and $P_3$. A compensating factor of $\sqrt{2}$ is applied to the diagonal pairs. Each of the vectors for point $Q_3$ is summed with the similarly directed vector for each other point over the whole scanning frame. The four vector sums will be denoted, as to magnitude and direction, by $V_{11}$, $V_{12}$, $V_{13}$, $V_{14}$ respectively for the line-focus condition below true focus. Vectors $V_{11}$ to $V_{14}$ are indicated in FIG. 4a to relate qualitatively to the astigmatic image of FIG. 2a. The process is repeated with the lens current reset to produce the line focus condition above true focus, the corresponding vectors for point $Q_3$ being denoted by $V_{21}$, $V_{22}$, $V_{23}$ and $V_{24}$. Vectors $V_{21}$ to $V_{24}$ are indicated in FIG. 4b to relate qualitatively to the astigmatic image of FIG. 2b. The effect of any systematic difference in the two conditions (such as a variation in probe current or an unequal displacement from the focused condition) is eliminated by normalising the vector summation. If the sums over the two frames are unequal a scaling factor is applied to the individual values for one of the frames so that equality is obtained.

As has been explained in principle the degree of severity of smearing of the image in a particular direction can be assessed by calculating the numerical difference between the summed intensity derivatives for the two frames in the relevant direction. Vector sums $V_{11}$ to $V_{24}$ represent the required values for the four directions of measurement. Thus by summing such differences for all the directions of measurement the sum, denoted by S, is a measure of astigmatism.

$$S = |V_{11} - V_{21}| + |V_{12} - V_{22}| + |V_{13} - V_{23}| + |V_{14} - V_{24}|$$

In the use of the computer merely as an aid to manual operation the value S is displayed on the unit 43 against a range of settings of stigmator excitation and that setting is chosen for which S has a minimum value. As an alternative to the VDU 43 the value of S may be displayed, after digital-to-analogue conversion, on an analogue meter or similar display.

For automatic stigmator control the accumulated data is further processed to determine the angle $\phi$. The 45° sector in which $\phi$ lies is identified by comparing the magnitudes of the change in pairs of corresponding vector sums between the two line focus conditions. Denoting the resultants by A and B, $$A = (V_{13} - V_{23}) - (V_{11} - V_{21})$$

and $$B = (V_{12} - V_{22}) - (V_{14} - V_{24})$$

The signs of A and B indicate the relevant sector as follows:

| A | B | Sector |
|---|---|--------|
| + | + | 0°–45° |
| − | + | 45°–90° |
| − | − | 90°–135° |
| + | − | 135°–180° |

Then for the first sector: $\phi = \alpha$, where $$\alpha = (\tan^{-1}|B|)/(\sqrt{2}. |A| + |B|)$$

For the second sector $\phi = (90 - \alpha)$, for the third sector $\phi = (90 + \alpha)$, and for the fourth sector $\phi = (180 - \alpha)$. The angle which determines the components of stigmator excitation, (which will be denoted by $\theta$) is in general related to $\phi$ by a constant which takes into account the arbitrary orientation of the stigmator coils and must be determined experimentally.

Having established a value for $\theta$ the value of stigmator excitation for minimum smearing must be found. With the correct $\sin \theta$ and $\cos \theta$ components of current fed to the stigmator coils the level of excitation (say M) is incremented through a range of steps and the amplitude S is calculated and stored for each step by scanning at least one pair of above-focus and below-focus frames each time. In order to identify the minimum in the curve of variation of S with M in accordance with one of the available techniques the stored values of this function are compared with a Gaussian function at a succession of relatively displaced positions. The Gaussian function is chosen as being of convenient shape for matching to the experimental curve. Differentiation of the resulting error curve enables the best match between the functions to be found so that the value of M corresponding to the minimum value of S can be precisely determined.

The focusing and astigmatism correction functions show some degree of interaction and it is preferred to refocus and then to refine the previously determined values of $\theta$ and M. The fine adjustment of the stigmator is carried out in two stages: one in which the angle is varied over the range $\theta \pm 10°$ in 2° steps and one in which a limited range of amplitude is scanned, the parameter S being minimised at each stage.

It has been emphasised that the procedure described for astigmatism correction can be followed or adapted as one controlled by the operator in which computing capacity is only called upon for assembling the vector data which defines the parameter S. Alternatively a computer having a 24K word memory has been successfully programmed and operated with a standard model of SEM for the automatic control of the focus and stigmator functions. The program is completed in about two minutes.

The procedure for automatic focusing depends on the principle that sharpness of focus is indicated by a rapid rate of change of intensity across the image. It is of course supposed that the nature of the specimen surface is such as to provide sufficient image detail within a reasonable size of scanning frame. Referring again to FIG. 3, for a picture point $Q_3$, the difference in intensity is measured between $Q_3$ and $Q_2$ and between $Q_3$ and $P_3$. As an approximation the sum of these differences can be taken to represent the gradient at point $Q_3$ and the sharpness of the image is characterised by the accumulation of corresponding difference measurements for all points in the frame. One frame is scanned for each of thirty two steps in lens current and the accumulated 'sharpness' value for each frame is stored. The lens current which corresponds to the maximum sharpness value is determined by following a Gaussian matching procedure similar to that used to detect minimum astigmatism. The value of lens current so determined is further refined by repeating the whole procedure of gradient measurement over progressively narrower ranges of current. The use of the 15-bit DAC 34 to control the lens current enables steps of 30μA to be made in a range up to 1.0 A. The full automatic focusing program provides an accuracy of about 2 μm at a working distance of 5 mm and is completed in about 100 seconds.

An important application of the procedures described in this specification lies in the operation of instruments such as electron beam microfabrication machines in which it is required to scan the beam over large fields of 5000 lines or more. Defocusing and astigmatism increase with the angle of deflection and become a serious limitation at the edges of the field. A program of automatic dynamic correction can be provided based on data from a selection of reference points at different distances from the centre of the field. At each reference point a small raster is scanned and the automatic focusing and stigmator control program is followed to determine the optimum coil currents. The current values are stored in the computer with the appropriate address information, the values at intermediate positions being estimated by interpolation if required, so that dynamic correction can be continuously applied as the probe is scanned across the field.

It will be apparent that analogous procedures for the investigation and correction of astigmatism can be followed for electrostatic instruments.

We claim:

1. In an electron beam probe instrument a method for investigating and correcting astigmatism comprising a sequence of automatic operations, namely: scanning an array of points on a specimen; setting the excitation of the objective lens to enable a focused image of the specimen to be produced; resetting the lens excitation in turn to a first value below the setting for focus and to a second value above the setting for focus; determining for the first and second values of lens excitation the directional derivatives of intensity in a plurality of directions for each point of the array; deriving the difference between the respective sums for all points of the array of the derivative in each direction, for the first value of excitation and the derivative in each corresponding direction for the second value of excitation; determining the sum of such differences, the sum, denoted by S, being a measure of the astigmatism; and operating astigmatism compensation means to minimise the value of S.

2. The method of claim 1 including the operation of normalising the directional derivatives determined for one of the first and second values of lens excitation with respect to those determined for the other value.

3. The method of claim 1 including the operation of deriving from the differences between corresponding summed derivatives a value representing the angle of smearing of the image, setting the field orientation of the astigmatism compensation means to a related angle effective to produce correction of astigmatism in the image, and determining the value of excitation of the astigmatism compensation means for which the value of S is close to a minimum.

4. The method of claim 1 in which for each point the derivatives of intensity are determined for four directions at intervals of 45°.

5. The method of claim 1 in which the operation of setting the lens excitation for focus includes the operations of determining the sum for all points of the intensity gradient at each point in the array and determining the value of lens excitation for which the sum of the gradients has a maximum value.

6. In an electron beam probe instrument, apparatus for investigating and correcting astigmatism comprising: means for causing the electron beam to scan an array of points on a specimen; means for setting the excitation of the objective lens to a value enabling a focused image of the specimen to be produced and to first and second values respectively below and above the setting for focus; means for determining the intensity of the image of each point in the array; means for storing such values of intensity; means for determining from the stored values the directional derivatives of intensity in a plurality of directions for each point for the first and second values of lens excitation; means for deriving the difference between the respective sums for all points of the array of the derivative in each direction for the first value of lens excitation and the derivative in each corresponding direction for the second value of lens excitation; means for determining the sum of such differences, the sum, denoted by S, being a measure of the astigmatism; and astigmatism compensation means operable in response to the value of S to cause S to be reduced to a minimum.

7. Apparatus according to claim 6 including means for normalising the directional derivatives determined for one of the first and second values of lens excitation with respect to those determined for the other value.

8. Apparatus according to claim 6 the astigmatism compensation means having means for manual control of excitation and means for displaying the value of the sum S for each of a succession of excitation settings, whereby the setting for which S is close to a minimum may be selected.

9. Apparatus according to claim 6 the astigmatism compensation means having means for programmed control of excitation in discrete steps, means for deriving from the differences between corresponding derivatives a value representing the angle of smearing of the image, means for setting the field orientation of the astigmatism compensation means to an angle related to the angle of smearing, effective to produce correction of the image, and means for determining the step in the excitation of the compensation means for which the value of S is close to a miminum.

10. Apparatus according to claim 6 in which the means for setting the lens excitation for focus includes means for determining the sum for all points of the intensity gradient at each point in the array and means for determining the value of lens excitation for which the sum of the gradients has a maximum value.

* * * * *